United States Patent
Roohparvar et al.

(10) Patent No.: US 6,356,137 B1
(45) Date of Patent: Mar. 12, 2002

(54) VOLTAGE BOOST CIRCUIT WITH LOW POWER SUPPLY VOLTAGE

(75) Inventors: Farzan Roohparvar, San Jose; Kamyab Mahouti, Sunnyvale, both of CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/603,405

(22) Filed: Jun. 26, 2000

(51) Int. Cl.$^7$ ................................................ H03K 17/16
(52) U.S. Cl. ...................................... 327/390; 327/536
(58) Field of Search ................................ 327/390, 530, 327/534, 535, 536, 538, 540, 547, 543, 589; 326/88; 307/110; 363/59, 60

(56) References Cited

U.S. PATENT DOCUMENTS

| | | | |
|---|---|---|---|
| 4,500,799 A | | 2/1985 | Sud et al. |
| 5,280,420 A | | 1/1994 | Rapp |
| 5,521,871 A | * | 5/1996 | Choi .................... 365/189.11 |
| 5,592,115 A | | 1/1997 | Kassapian |
| 5,677,645 A | * | 10/1997 | Merritt ...................... 327/536 |
| 5,701,096 A | * | 12/1997 | Higashihi ................... 327/536 |
| 5,898,333 A | * | 4/1999 | Kuo et al. ................... 327/390 |
| 5,901,055 A | * | 5/1999 | Yi et al. ........................ 363/60 |
| 5,940,333 A | * | 8/1999 | Chung .................... 365/189.09 |
| 5,952,851 A | * | 9/1999 | Yuen ........................... 326/88 |
| 5,973,979 A | | 10/1999 | Chang et al. |
| 6,031,741 A | * | 2/2000 | McDonald et al. ........... 363/60 |
| 6,046,626 A | * | 4/2000 | Saeki et al. ................. 327/536 |
| 6,069,837 A | * | 5/2000 | Micheloni et al. ..... 365/230.06 |
| 6,127,875 A | * | 10/2000 | Allen et al. ................. 327/306 |
| 6,225,854 B1 | * | 5/2001 | Cha ............................ 327/536 |

* cited by examiner

Primary Examiner—Timothy P. Callahan
Assistant Examiner—Hai L. Nguyen
(74) Attorney, Agent, or Firm—Townsend and Townsend and Crew LLP

(57) ABSTRACT

Method and circuitry for efficiently boosting voltage for low power supply applications. In one embodiment a phase boosting circuit that boosts a clock signal to substantially twice the power supply voltage level in a single half-cycle is implemented. The circuit eliminates the need for depletion transistors and can thus be implemented using conventional complementary metal-oxide-semiconductor (CMOS) fabrication processes. A novel voltage summing circuit allows the phase doubler to achieve greater boosting capability for applications with ultra low power supply voltages.

18 Claims, 3 Drawing Sheets

VOLTAGE BOOST CIRCUIT WITH LOW POWER SUPPLY VOLTAGE

BACKGROUND OF THE INVENTION

The present invention relates in general to integrated circuits, and in particular to a voltage boost circuit that provides efficient voltage boosting for circuits operating at lower power supply voltages.

Certain integrated circuit applications require internally generating a secondary voltage source that is often larger in magnitude than the primary externally supplied power source. For example, some non-volatile memory circuits, such as electrically erasable programmable read only memories (EEPROMs), that may use a single power supply voltage of, for example, 3.5 volts, also require a programming or erase voltage that is much larger in magnitude (e.g., 12 volts). Voltage multiplying or charge pump techniques have been developed to internally generate the higher voltage from the primary supply voltage. Charge pump circuits take advantage of charge storing capability of capacitors to, for example, double the level of a primary supply voltage by bootstrapping. A typical charge pump circuit may include transistors that transfer charge to one or more capacitors in response to an oscillating (or clock) signal. In some implementations, the charge pump circuit requires non-overlapping clock signals whose voltage levels are themselves boosted to higher than power supply level. The higher the boosted level of the clock signal, the faster the charge pump can give rise to the target output voltage level.

One known circuit implementation for generating boosted clock signals for charge pumps is shown in FIG. 1. The signal at the output node, OUT, is discharged to ground by n-channel transistor Q1 when VDIS is high. When VDIS goes low, transistor Q1 turns off and p-channel transistor Q3 turns on. A depletion mode (negative Vt) transistor Q2 operates to isolate OUT from transistor Q3. During the first half of the clock cycle, signal VPCH turns on transistor Q2 allowing OUT to get precharged up to the power supply voltage Vcc. During the second half of the clock cycle a boost signal VBT is applied to one terminal of pump capacitor Cp raising the voltage level at OUT from Vcc up toward twice Vcc. The negative threshold voltage of depletion transistor Q2 allows output voltage OUT to swing above the precharge voltage. The operation of this circuit is illustrated by the timing diagram of FIG. 2.

There are a number of drawbacks with this type of boosting circuit. First, the process must provide for a depletion mode transistor, which is not readily available in conventional CMOS fabrication processes. Second, the efficiency of the circuit is reduced by the fact that pumping occurs only during a portion of the clock half-cycle, as opposed to the entire half-cycle. Current leakage through the depletion transistor further reduces the circuit efficiency, where the output voltage can get close to but not quite double the power supply voltage. This effect is further exacerbated at lower power supply voltages where it becomes increasingly difficult to fully turn off the depletion transistor. At lower power supply voltages, therefore, this circuit becomes ineffective and ultimately non-functional.

There is a need for a voltage boosting circuit that operates efficiently at lower power supply voltages.

SUMMARY OF THE INVENTION

The present invention provides method and circuitry for efficiently boosting voltage for low power supply applications. In a specific embodiment, the present invention provides a phase boosting circuit that boosts a clock signal to substantially twice the power supply voltage level in a single half-cycle. The circuit eliminates the need for a depletion transistor and can thus be implemented using conventional complementary metal-oxide-semiconductor (CMOS) fabrication processes. A novel voltage summing circuit allows the phase doubler of the present invention to achieve greater boosting capability for applications with ultra low power supply voltages.

Accordingly, in one embodiment, the present invention provides a voltage boosting circuit having an input that receives an input signal and an output that generates a boosted output signal, the circuit including a pull-down transistor coupled between the output of the circuit and a low potential and having an input coupled to the input of the circuit; a charge transfer transistor coupled between a precharge node and the output of the circuit and having an input coupled to the input of the circuit; a precharge transistor coupled between a power supply and the precharge node and having an input coupled to the output of the circuit; a capacitive element having a first terminal coupled to the precharge node; and an inverter having an input coupled to the input of the circuit and an output coupled to a second terminal of the capacitive element.

In another embodiment, the present invention provides a low power voltage boosting circuit the includes two voltage boosting circuits as described in the preceding paragraph, whose outputs are capacitively summed by a third boost circuit, wherein the third boost circuit includes a pull-down transistor, a charge transfer transistor and a precharge transistor coupled as described above.

A better understanding of the nature and advantages of the voltage boosting circuit according to the present invention will be gained with reference to the detailed description below and the accompanying drawings.

DETAILED DESCRIPTION OF THE PREFERRED EMBODIMENTS

Figure 1:
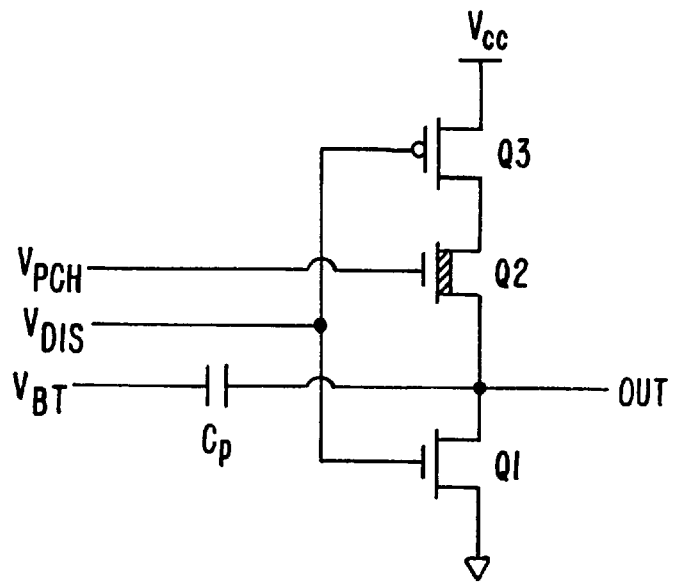
FIG. 1 is a circuit schematic of a prior art phase boost circuit.
Figure 2:
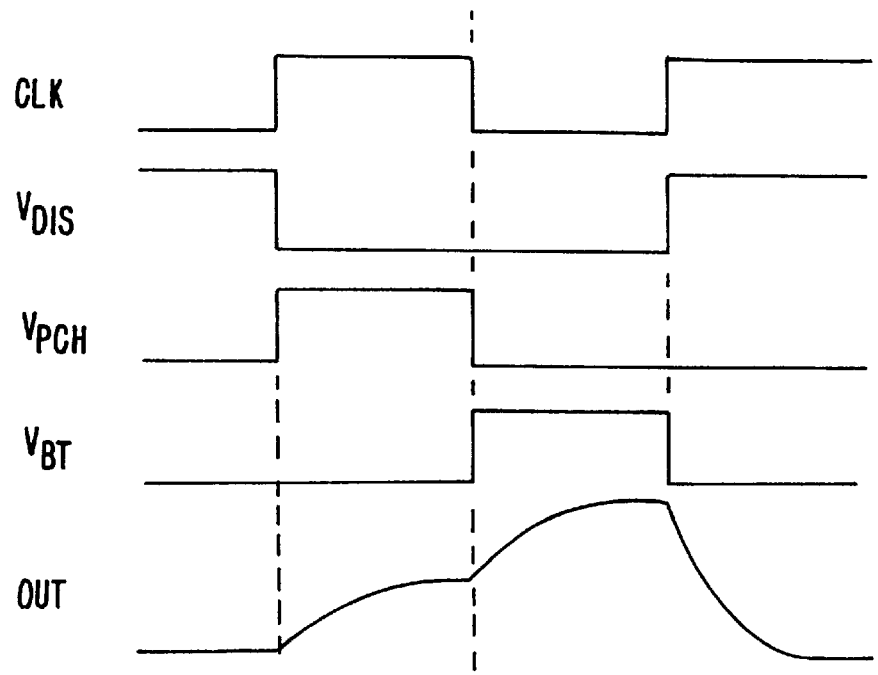
FIG. 2 is a timing diagram illustrating the operation of the phase boost circuit of FIG. 1.
Figure 3:
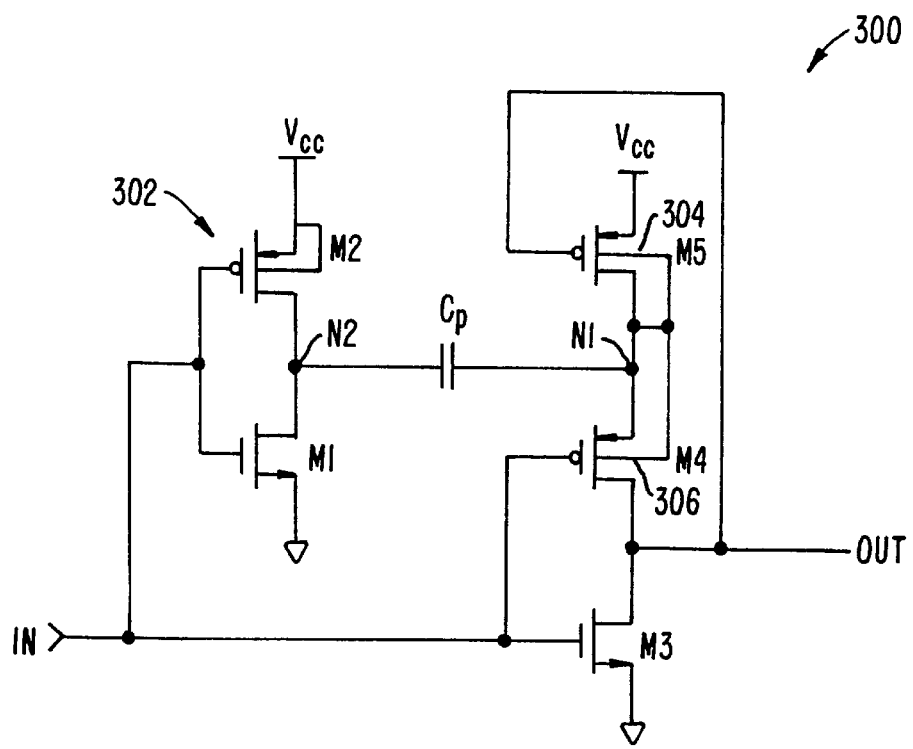
FIG. 3 is an exemplary circuit implementation for a voltage boosting circuit according to a specific embodiment of the present invention.

Referring to FIG. 3, there is shown an exemplary circuit implementation for a voltage boost circuit 300 according to the present invention. In this embodiment, the voltage boosting technique is employed as a phase doubler for charge pump circuits such as those used in EEPROM devices. It is to be understood, however, that the technique of the present invention may be employed in other types of circuits requiring voltage boosting. Broadly, voltage boost circuit 300 includes a pump capacitor Cp, one terminal of which, at node N1, is precharged to the power supply voltage Vcc during one phase (e.g., low half-cycle) of the input clock signal. During the other phase (e.g., high half-cycle) of the clock, the voltage at node N1 is boosted by an amount equal to Vcc to achieve a doubling of the clock level. The boosted signal is transferred to the output by a charge transfer transistor M4. To accomplish this efficiently, circuit 300 includes an n-channel pull-down (or discharge) transistor M3 that connects between the output node OUT and ground, with its gate terminal driven by the input clock signal IN. A p-channel precharge transistor M5 connects between node N1 and the power supply Vcc. The gate terminal of precharge transistor M5 is driven by the output signal fed back from output node OUT. The charge transfer transistor M4 connects between node N1 and output node OUT, and has its gate driven by the input clock signal IN. Charge pump capacitor Cp connects between node N1 and node N2, where node N2 is the output of a CMOS inverter 302. CMOS inverter 302 is made up of a p-channel pull-up transistor M2 and an n-channel pull-down transistor M1. The input of inverter 302 is also driven by the input clock signal IN.

Figure 4:
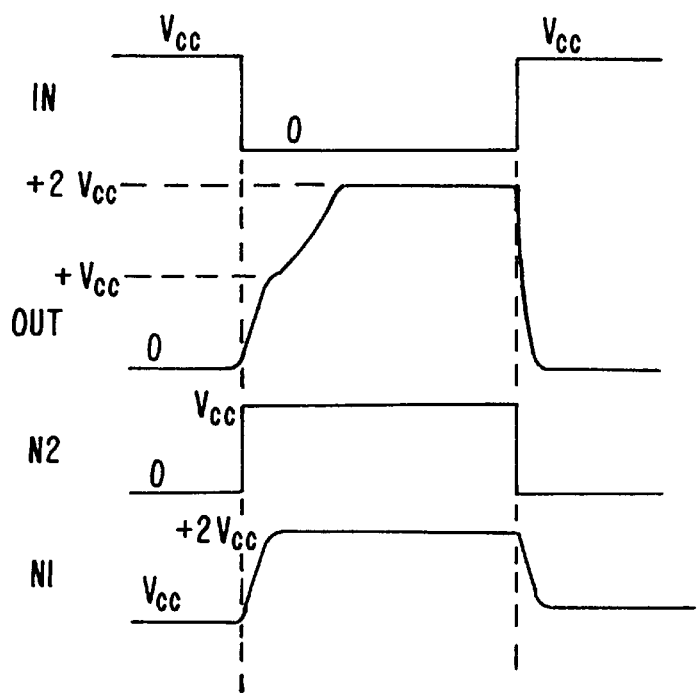
FIG. 4 is a timing diagram illustrating the operation of the voltage boost circuit of FIG. 3.

The operation of voltage boost circuit 300 will be described below in connection with the timing diagram shown in FIG. 4. When the input clock signal IN is high, both n-channel transistors M1 and M3 are turned on pulling OUT and node N2 down to ground, respectively. With OUT at ground, precharge transistor M5 turns on pulling node N1 up to Vcc. Capacitor Cp is thus charged to Vcc. When the clock signal IN transitions low, n-channel transistors M1 and M3 turn off, and p-channel transistors M2 and M4 turn on. The conductive channel of transistor M4 transfers the charge from node N1 to output node OUT pulling it up to Vcc. As OUT rises to Vcc, p-channel precharge transistor M5 turns off isolating node N1 from Vcc. At about the same time, the conductive channel of p-channel transistor M2 pulls node N2 up toward Vcc. The Vcc jump at node N2 is capacitively coupled to node N1, raising the potential at node N1 to about 2Vcc. The 2Vcc level is transferred to output node OUT via p-channel transistor M4. In this fashion, the voltage level at OUT is doubled within one half cycle of the input clock signal.

There are a number of features of the present invention that enables voltage boosting circuit 300 to double the clock phase efficiently. The exemplary circuit implementation shown in FIG. 3 assumes an n-well CMOS process where the P-channel transistors are formed inside an n-type well region. Thus, the body (or well) terminal of the p-channel transistors can be separately biased. Normally, the body terminals (n-well) of the p-channel transistors are tied to the power supply Vcc, as is the case for p-channel transistor M2 in inverter 302. Body terminals 304 and 306 of p-channel transistors M5 and M4, however, are tied to node N1 instead of Vcc. This ensures that when the voltage at node N1 rises above Vcc, the inherent p-n junctions, which are formed between the source (p+)/drain (p+) and body (n-well) of transistors M4 and M5, do not become forward biased. Otherwise, the voltage level at node N1 would be limited to one diode drop (Vd) above Vcc.

Care is also taken to make sure that when node N1 is charged to 2Vcc, p-channel transistor M4 transfers the charge to output node OUT as quickly as possible so that the gate voltage of p-channel transistor M5 does not at any point drop below the potential at node N1. That is, for transistor M5 to perform its isolating function properly, the rise in voltage at its gate terminal must not lag that of node N1. Proper layout techniques can ensure that the delays through the interconnect lines provide the correct timing.

Figure 5:
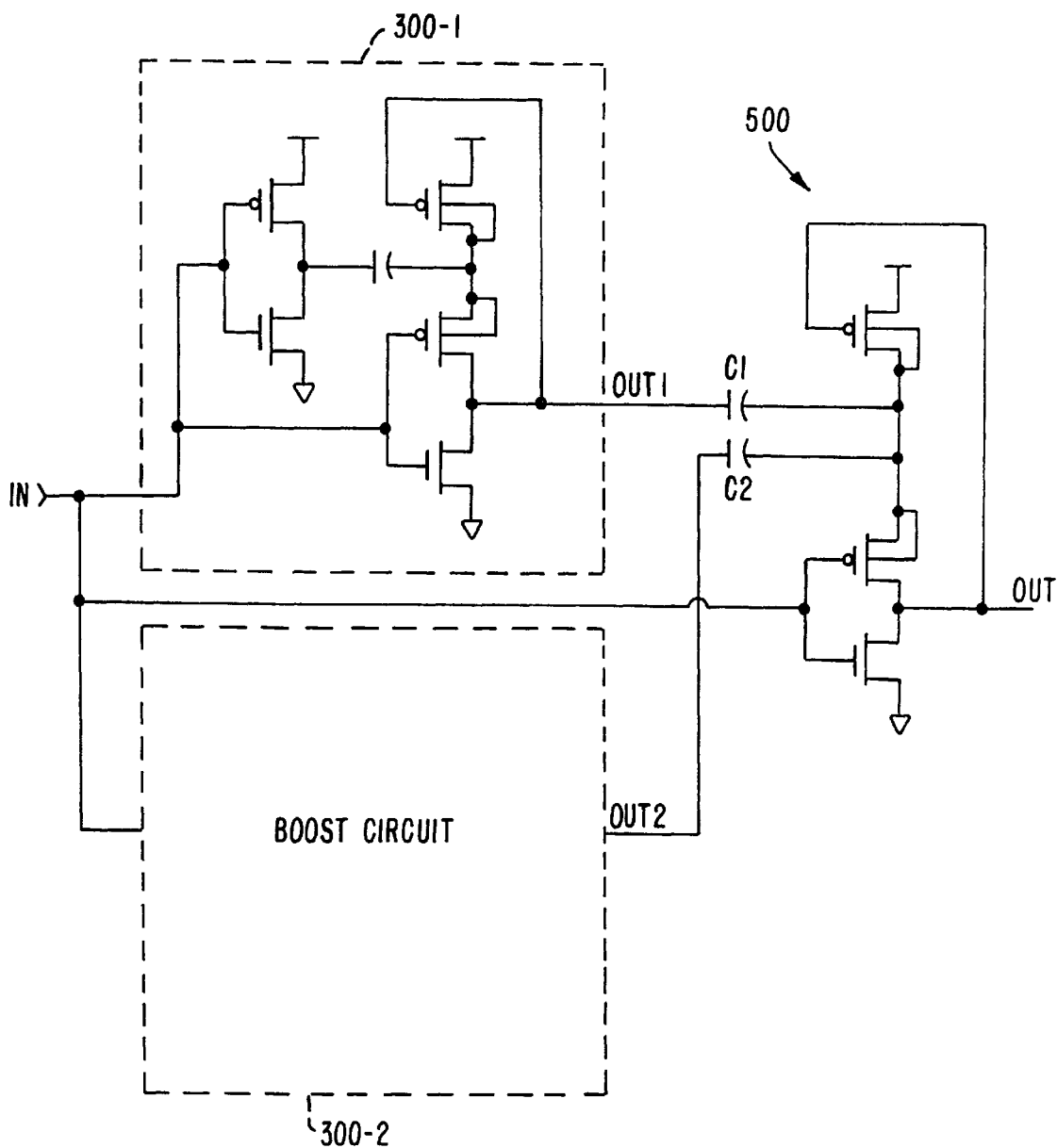
FIG. 5 is an exemplary circuit implementation for a voltage boosting circuit according to another specific embodiment of the present invention.

For circuit applications with ultra low power supply voltage, the present invention offers and alternative embodiment wherein boosted outputs of multiple boost circuits of the type shown in FIG. 3 are summed together to achieve an even higher boosted voltage. One exemplary circuit implementation for this embodiment is shown in FIG. 5. In this embodiment, two boost circuits 300-1 and 300-2 of the type shown in FIG. 3 each generate 2Vcc at their respective outputs OUT1 and OUT2. Outputs OUT1 and OUT2 are then capacitively coupled, via capacitors C1 and C2, to a third boost circuit 500. Boost circuit 500 is a modified version of boost circuit 300 and includes the second (or output) stage of boost circuit 300. Boost circuit 500 operates essentially the same as circuits 300 except that it includes two pump capacitors C1 and C2 each of which receives an already boosted signal at its first (or input) terminal. The two capacitors C1 and C2 form a summing network and in combination with circuit 500 operate to further boost the already boosted and summed signals. In other embodiments, more than two boost circuits 300 can be combined in a similar fashion to provide for additional boosting of the output voltage. It is also possible to achieve further boosting of a signal by combining multiple circuits of the type shown in FIG. 5.

In conclusion, the present invention provides circuit techniques for efficiently boosting voltages for circuits operating with low power supply voltages. The circuit of the present invention can be implemented using conventional CMOS processes. While the above provides a complete description of specific embodiments of the present invention, it is possible to use various alternatives, modifications and equivalents. For example, one may use a p-well CMOS process with the polarity of the transistors changed from n-channel to p-channel and vice versa. Also, similar circuit techniques may be used to generate a high negative voltage. The pump capacitors may be made of any type of capacitive element including poly capacitors or gate capacitance of MOS transistors. Therefore, the scope of the present invention should be determined not with reference to the above description alone but should, instead, be determined with reference to the appended claims along with their full scope of equivalents.

What is claimed is:

1. A high voltage generating circuit having an input that receives an input signal and an output that provides a final boosted output signal, the high voltage generating circuit comprising:

a first voltage boosting circuit operable to generate a first boosted output signal in response to the input signal;

a second voltage boosting circuit operable to generate a second boosted output signal in response to the input signal; and a summing circuit coupled to said first and second voltage boosting circuits configured to add voltage levels of said first boosted output signal and said second boosted output signal to generate the final boosted output signal, wherein the first voltage boosting circuit comprises:

a first pull-down transistor coupled between an output of the first voltage boosting circuit and a low potential and having an input coupled to the input of the high voltage generating circuit;

a first charge transfer transistor coupled between a first precharge node of the first voltage boosting circuit and the output of the first voltage boosting circuit and having an input coupled to the input of the high voltage generating circuit;

a first precharge transistor coupled between a power supply and the first precharge node and having an input coupled to the output of the first voltage boosting circuit;

a first capacitive element having a first terminal coupled to the first precharge node; and a first inverter having an input coupled to the input of the high voltage generating circuit and an output coupled to a second terminal of the first capacitive element.

2. The high voltage generating circuit of claim 1, wherein a body terminal of the first charge transfer transistor couples to the first precharge node.

3. The high voltage generating circuit of claim 1, wherein a body terminal of the first precharge transfer transistor couples to the first precharge node.

4. The high voltage generating circuit of claim 1, wherein the first charge transfer transistor and the first precharge transistor are p-channel transistors, and the first pull-down transistor is an n-channel transistor.

5. The high voltage generating circuit of claim 4, wherein the power supply provides a positive power supply voltage, and the low potential is ground.

6. The high voltage generating circuit of claim 5, wherein the first inverter comprises a p-channel pull-up transistor coupled between the second terminal of the first capacitive element and the power supply, and an n-channel transistor coupled between the second terminal of the first capacitive element and ground.

7. The high voltage generating circuit of claim 1, wherein the first voltage boosting circuit boosts a voltage level of the input signal to a voltage that is at least twice the voltage level of the input signal.

8. The high voltage generating circuit of claim 7, wherein the first voltage boosting circuit is a phase doubler for a charge pump.

9. The high voltage generating circuit of claim 1, wherein the second voltage boosting circuit comprises:

a second pull-down transistor coupled between an output of the second voltage boosting circuit and a low potential and having an input coupled to the input of the high voltage generating circuit;

a second charge transfer transistor coupled between a second precharge node of the second voltage boosting circuit and the output of the second voltage boosting circuit and having an input coupled to the input of the high voltage generating circuit;

a second precharge transistor coupled between a power supply and the second precharge node and having an input coupled to the output of the second voltage boosting circuit;

a second capacitive element having a first terminal coupled to the second precharge node; and a second inverter having an input coupled to the input of the high voltage generating circuit and an output coupled to a second terminal of the second capacitive element.

10. The high voltage generating circuit of claim 9, wherein a body terminal of the second charge transfer transistor couples to the second precharge node.

11. The high voltage generating circuit of claim 9, wherein a body terminal of the second charge transfer transistor couples to the second precharge node.

12. The high voltage generating circuit of claim 11, wherein the second inverter comprises a p-channel pull-up transistor coupled between the second terminal of the second capacitive element and the power supply, and an n-channel transistor coupled between the second terminal of the second capacitive element and ground.

13. A high voltage generating circuit, comprising:

a first voltage boosting circuit operable to generate a first boosted signal said first voltage boosting circuit having an input coupled to receive an input signal and an output;

a second voltage boosting circuit operable to generate a second boosted signal, said second voltage boosting circuit having an input coupled to receive the input signal and an output; and a third voltage boosting circuit coupled to receive the first and second boosted signals, the third voltage boosting circuit operable to generate a third boosted signal that is greater in magnitude than those of the first and second boosted signals wherein each of the first, second and third boosting circuits comprises:

a pump capacitive element coupled between a first node and a precharge node;

a precharge transistor coupled between the precharge node and a power supply;

a charge transfer transistor coupled between the precharge node and the output; and a pull-down transistor coupled between the output node and a discharge potential.

14. The high voltage generating circuit of claim 13, wherein gate terminals of the charge transfer and pull-down transistors in each of the first, second and third voltage boosting circuits are coupled to receive the input signal.

15. The high voltage generating circuit of claim 14, wherein a gate terminal of the precharge transistor in each of the first, second, and third voltage boosting circuits, respectively, couples to the output of its respective voltage boosting circuit.

16. The high voltage generating circuit of claim 15, wherein the third voltage boosting circuit further comprises a second pump capacitive element coupled between a second node and its precharge node, and wherein, the first node and the second node in the third voltage boosting circuit couple to the outputs of the first voltage boosting circuit and the second voltage boosting circuit, respectively.

17. The high voltage generating circuit of claim 16, wherein each of the first and second voltage boosting circuits further comprises an inverter having an input coupled to receive the input signal and an output coupled to the first node in each of the respective voltage boosting circuits.

18. A method of generating a boosted voltage, comprising:

boosting an input signal using a first charge pump circuit to generate a first boosted signal;

boosting the input signal using a second charge pump circuit to generate a second boosted signal;

summing the first and second boosted signals; and boosting a summed value of the first and second boosted signals using a third charge pump circuit to generate a boosted signal of larger magnitude, wherein the summing function comprises capacitively coupling, in parallel, the first and the second boosted signals to the third charge pump circuit.

* * * * *